US009242865B2

(12) United States Patent
Sinton et al.

(10) Patent No.: US 9,242,865 B2
(45) Date of Patent: Jan. 26, 2016

(54) SYSTEMS AND METHODS FOR PRODUCTION OF GRAPHENE BY PLASMA-ENHANCED CHEMICAL VAPOR DEPOSITION

(71) Applicant: LOCKHEED MARTIN CORPORATION, Bethesda, MD (US)

(72) Inventors: Steven W. Sinton, Palo Alto, CA (US); Peter V. Bedworth, Los Gatos, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 149 days.

(21) Appl. No.: 14/192,796

(22) Filed: Feb. 27, 2014

(65) Prior Publication Data
US 2014/0255621 A1 Sep. 11, 2014

Related U.S. Application Data

(60) Provisional application No. 61/773,051, filed on Mar. 5, 2013.

(51) Int. Cl.
*C23C 16/26* (2006.01)
*H05H 1/24* (2006.01)
*C01B 31/04* (2006.01)

(52) U.S. Cl.
CPC .................................. *C01B 31/0453* (2013.01)

(58) Field of Classification Search
CPC .... C23C 16/26; C23C 16/50; C01B 31/0453; C01B 2204/22; H05H 1/24
See application file for complete search history.

(56) References Cited

U.S. PATENT DOCUMENTS

2008/0279749 A1\* 11/2008 Probst ...................... C08K 3/04 423/415.1
2010/0224851 A1 9/2010 Colombo et al.

(Continued)

FOREIGN PATENT DOCUMENTS

CN 103420360 12/2013
JP 2000-323052 \* 11/2000

(Continued)

OTHER PUBLICATIONS

Terasawa, Tomo-o, et al., "Growth of graphene on Cu by plasma enhanced chemical vapor deposition". Carbon 50 (2012) 869-874.\*
Hiramatsu, Mineo, et al., "Fabrication of Graphene-Based Films Using Microwave-Plasma-Enhanced Chemical Vapor Deposition". Japanese Journal of Applied Physics 52 (2013) 01AK04, pp. 1-5.\*
Woehrl, Nicolas, et al., "Plasma-enhanced chemical vapor deposition of graphene on copper substrates". AIP Advances 4, 047128 (2014), pp. 1-9.\*
JunLei, Qi, et al., "Synthesis of graphene on a Ni film by radio-frequency plasma-enhanced chemical vapor deposition." Chinese Science Bulletin, Aug. 2012, vol. 57, No. 23, pp. 3040-3044.\*
Soin, Navneet, et al., "Microstructural and electrochemical properties of vertically aligned few layered graphene )FLG) nanoflakes and their application in methanol oxidation". Materials Chemistry and Physics 129 (2011) 1051-1057.\*

(Continued)

*Primary Examiner* — Bret Chen
(74) *Attorney, Agent, or Firm* — McDermott Will & Emery LLP

(57) ABSTRACT

Production of bulk quantities of graphene for commercial ventures has proven difficult due to scalability issues in certain instances. Plasma-enhanced chemical vapor deposition of graphene can address at least some of these issues. Methods for production of graphene by plasma-enhanced chemical vapor deposition can include: providing a metal substrate and a carbonaceous electrode, at least a portion of the metal substrate being located proximate to the carbonaceous electrode with a gap defined therebetween; applying a potential between the metal substrate and the carbonaceous electrode; exciting a plasma-forming gas in the gap between the metal substrate and the carbonaceous electrode in the presence of the applied potential, thereby forming a plasma; ablating a reactive carbon species from the carbonaceous electrode in the presence of the plasma; and growing graphene on the metal substrate from the reactive carbon species.

20 Claims, 1 Drawing Sheet

(56) References Cited

U.S. PATENT DOCUMENTS

| | | | |
|---|---|---|---|
| 2011/0091647 A1 | 4/2011 | Colombo et al. | |
| 2011/0100955 A1* | 5/2011 | Pushparaj | B82Y 10/00 216/37 |
| 2011/0269629 A1* | 11/2011 | Giustino | B82Y 30/00 505/100 |
| 2012/0048181 A1 | 3/2012 | Barker et al. | |
| 2012/0141799 A1* | 6/2012 | Kub | B82Y 30/00 428/408 |
| 2012/0225296 A1 | 9/2012 | Zhong et al. | |
| 2012/0282419 A1* | 11/2012 | Ahn | B82Y 30/00 428/34.8 |
| 2013/0174968 A1 | 7/2013 | Vlassiouk et al. | |
| 2013/0312662 A1 | 11/2013 | Hauck | |
| 2013/0323157 A1 | 12/2013 | Li | |
| 2013/0327981 A1 | 12/2013 | Yamada et al. | |
| 2014/0313636 A1* | 10/2014 | Tour | C01B 31/0438 361/502 |
| 2015/0037515 A1* | 2/2015 | Fisher | C01B 31/0438 427/577 |
| 2015/0059571 A1* | 3/2015 | Denton | C01B 31/024 95/28 |

FOREIGN PATENT DOCUMENTS

| | | |
|---|---|---|
| JP | 2013249530 | 12/2013 |
| KR | 101332796 | 11/2012 |
| KR | 1020130128860 | 11/2013 |
| WO | WO-2012008789 | 4/2012 |
| WO | WO-2013052939 | 4/2013 |
| WO | WO-2013126671 | 8/2013 |
| WO | WO-2013172791 | 11/2013 |
| WO | WO-2013172792 | 11/2013 |

OTHER PUBLICATIONS

Brownson, Dale A.C., et al., "In situ electrochemical characterisation of graphene and various carbon-based electrode materials: an internal standard approach". RSC Adv., 2015, 5, 37281-37286.*

Malesivic, et al., "Synthesis of few-layer graphene via microwave plasma-enhanced chemical vapour deposition," Nanotechnology, 19:2008, 305604 (6 pp.).

Ismach, et al., "Direct Chemical Vapor Deposition of Graphene on Dielectric Surfaces," Nano Lett., 10:2010, pp. 1542-1548.

Terasawa, et al., "Growth of graphene on Cu by plasma enhanced chemical vapor deposition," Carbon, 50:2012, pp. 869-874.

Vitchev, et al., "Initial stages of few-layer graphene growth by microwave plasma-enhanced chemical vapour deposition," Nanotechnology, 21:2010, 095602 (7 pp.).

Woo, et al., "Large-grained and Highly ordered Graphene Synthesized by Radio frequency Plasma-enhanced Chemical Vapor Deposition," ECS Transactions, 19:2009, pp. 111-114.

Lee, et al., "Graphene growth directly on functional substrate," http://hal-polytechnique.archives-ouvertes.fr/hal-00525357/fr/, available online Oct. 11, 2010, 10 pp.

Jacobberger, et al., "Graphene Growth Dynamics on Epitaxal Cooper Thin Films," Chem. Mater., published online Feb. 18, 2013.

Kim, et al., "H2-free synthesis of monolayer graphene with controllable grain size by plasma enhanced chemical vapor deposition," Nanoscale, 5:2013, 22 pp.

* cited by examiner

SYSTEMS AND METHODS FOR PRODUCTION OF GRAPHENE BY PLASMA-ENHANCED CHEMICAL VAPOR DEPOSITION

CROSS-REFERENCE TO RELATED APPLICATIONS

This application claims the benefit of priority under 35 U.S.C. §119 from U.S. Provisional Patent Application 61/773,051, filed Mar. 5, 2013, which is incorporated herein by reference in its entirety.

STATEMENT REGARDING FEDERALLY SPONSORED RESEARCH OR DEVELOPMENT

Not applicable.

FIELD

The present disclosure generally relates to carbon nanomaterials, and, more specifically, to methods and systems for production of graphene.

BACKGROUND

Graphene represents an ato'mically thin layer of carbon in which the carbon atoms reside at regular two-dimensional lattice positions within a single sheet or a few stacked sheets (e.g., about 10 or less) of fused six-membered carbon rings. In its various forms, this material has garnered widespread interest for use in a number of applications, primarily due to its favorable combination of high electrical and thermal conductivity values, good mechanical strength, and unique optical and electronic properties. Of particular interest to industry are large-area graphene films for applications such as, for example, special barrier layers, coatings, large area conductive elements (e.g., RF radiators or antennas), and flexible electronics. A number of contemplated graphene applications have also been proposed for carbon nanotubes, since these two materials have certain properties that are comparable to one another. However, an advantage of graphene over carbon nanotubes is that graphene can generally be produced in bulk much more inexpensively than can the latter, thereby addressing perceived supply and cost issues that have been commonly associated with carbon nanotubes.

Despite the fact that graphene is generally synthesized more easily than are carbon nanotubes, there remain issues with production of graphene in quantities sufficient to support various commercial operations. Scalability to produce large area graphene films represents a particular problem. The most scalable processes developed to date for making graphene films utilize chemical vapor deposition (CVD) technology. In typical CVD processes, a carbon-containing gas is decomposed at high temperatures into various reactive carbon species, which then deposit upon a suitable growth catalyst and reorganize to form a graphene film. In typical CVD graphene syntheses, a carbon-containing gas and a copper-containing substrate are heated to a high temperature (e.g., about 900° C.-1000° C.) that is just below the melting point of the copper (i.e., 1061° C.). Both metallic copper substrates and copper-coated substrates can be used (e.g., nickel or silicon carbide substrates coated with copper). The CVD growth process can take place at either atmospheric pressure or a sub-atmospheric pressure. Due to the high temperatures employed in typical CVD processes, as well as the common use of reduced pressures during growth, scaling to afford graphene growth over large substrate areas can be expensive and complex. Further, since CVD growth processes often operate in the near-melting point regime of the substrate, substrate deformation can commonly occur, which can be undesirable for precision applications. CVD growth of graphene may not be possible at all on certain low melting substrates.

In view of the foregoing, improved processes for producing bulk quantities of graphene, particularly deposition of graphene films over a large surface area, would represent a substantial advance in the art. The present disclosure satisfies the foregoing need and provides related advantages as well.

SUMMARY

In some embodiments, methods for production of graphene by plasma-enhanced chemical vapor deposition can include providing a metal substrate and a carbonaceous electrode, applying a potential between the metal substrate and the carbonaceous electrode, exciting a plasma-forming gas in a gap between the metal substrate and the carbonaceous electrode in the presence of the applied potential to form a plasma, ablating a reactive carbon species from the carbonaceous electrode in the presence of the plasma, and growing graphene on the metal substrate from the reactive carbon species. At least a portion of the metal substrate is located proximate to the carbonaceous electrode with a gap defined therebetween.

In some embodiments, methods for production of graphene by plasma-enhanced chemical vapor deposition can include providing a metal substrate and a carbonaceous electrode, conveying the metal substrate by the carbonaceous electrode via a reel-to-reel processing line between a pay-out reel and a take-up reel, applying a potential between the metal substrate and the carbonaceous electrode via the reel-to-reel processing line, flowing a plasma-forming gas in a gap between the metal substrate and the carbonaceous electrode in the presence of the applied potential to form a plasma upon exciting the plasma-forming gas, ablating a reactive carbon species from the carbonaceous electrode in the presence of the plasma, and growing graphene on the metal substrate from the reactive carbon species while the metal substrate is being conveyed. At least a portion of the metal substrate is located proximate to the carbonaceous electrode with a gap defined therebetween.

In some embodiments, systems for continuous production of graphene by plasma-enhanced chemical vapor deposition can include: a reaction chamber, a reel-to-reel processing line configured to convey a metal substrate within the reaction chamber between a pay-out reel and a take-up reel, a carbonaceous electrode housed within the reaction chamber and disposed proximate to a location through which the metal substrate is conveyed, and a gas inlet configured to flow a plasma-forming gas in a gap between the metal substrate and the carbonaceous electrode. The carbonaceous electrode and the reel-to-reel processing line are electrically connected so as to apply a potential between the metal substrate and the carbonaceous electrode.

The foregoing has outlined rather broadly the features of the present disclosure in order that the detailed description that follows can be better understood. Additional features and advantages of the disclosure will be described hereinafter. These and other advantages and features will become more apparent from the following description taken in conjunction with the drawings.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1:
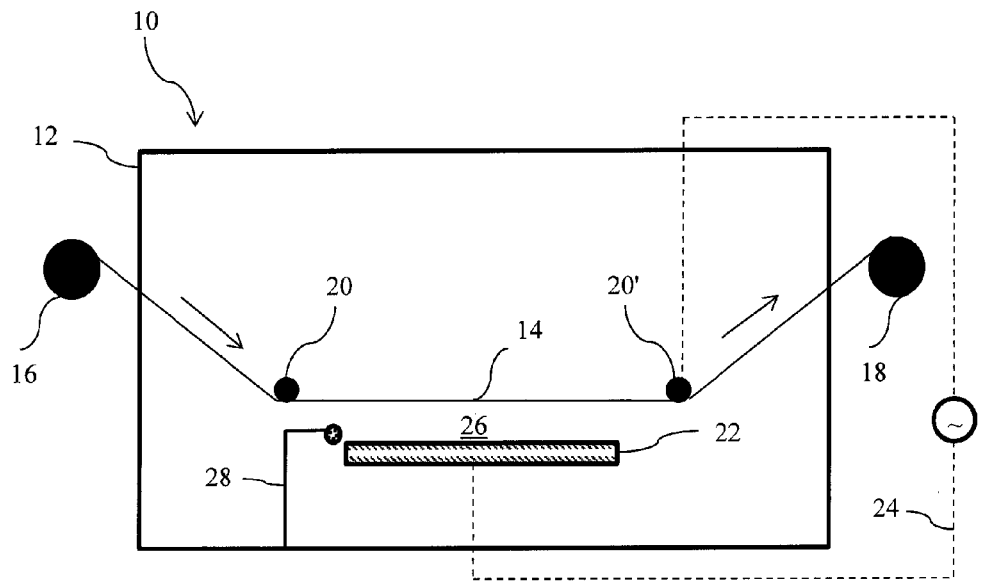
FIGS. 1 and 2 show schematics of illustrative systems for producing graphene by plasma-enhanced chemical vapor deposition according to one or more embodiments described herein.

The present disclosure is directed, in part, to methods for production of graphene by plasma-enhanced chemical vapor deposition (PECVD), particularly continuous or semi-continuous graphene production processes. The present disclosure is also directed, in part, to systems configured for continuous production of graphene by PECVD.

As discussed above, the high temperatures associated with conventional CVD processes for producing graphene can be problematic in many aspects, not the least of which is thermal deformation or damage of a substrate under the growth conditions. In addition, the sub-atmospheric pressures utilized during many common CVD processes can be problematic from an engineering standpoint in large scale graphene production. Conversion efficiency of a carbon-containing gas into graphene can also be relatively poor in many common CVD processes, thereby necessitating use of large quantities of the carbon-containing gas and resulting in increased costs.

The present inventors recognized that improved PECVD processes could be used to provide a number of advantages in the production of graphene, particularly in terms of scalability to generate large area graphene films. Foremost, PECVD processes can produce reactive carbon species at lower temperatures than can related CVD processes, due to the reactivity of the plasma, thereby lowering the risk of substrate deformation or damage in PECVD processes. Further, by judicious orientation of the plasma within a CVD reaction chamber, the plasma can convey energy to both a carbonaceous source material and to a substrate, including a catalyst disposed thereon, which can reduce the need to externally raise the temperature during the deposition process. In this regard, applying plasma energy to a carbonaceous source material can decrease the decomposition temperature needed to form a reactive carbon species for graphene production, and applying plasma energy to a graphene growth substrate and its deposited catalyst is believed to facilitate reorganization of the reactive carbon species on the substrate to form graphene. Both DC and radiofrequency plasmas can be used to accomplish the foregoing.

In addition, the inventors recognized that improved PECVD processes might significantly reduce the quantities of a carbon-containing gas needed to produce graphene, thereby lowering production costs. Even more specifically, the inventors identified various synthetic configurations in which the input of a carbon-containing gas to a graphene synthesis process is largely replaced with a carbonaceous electrode as a source of a reactive carbon species. The carbonaceous electrode can be disposed in close proximity to the substrate, which can result in a decreased incidence of premature recombination of the reactive carbon species and increased graphene production. Moreover, the inventors recognized that by establishing a suitable potential between the carbonaceous electrode and the substrate in close proximity thereto, a plasma could be established in the gap defined between the two in the presence of a plasma-forming gas. Due to the close proximity of the plasma to both the carbonaceous electrode and the substrate, the advantages described above can be realized.

The systems and methods described herein for PECVD growth of graphene are further advantageous in that they allow for further regulation of the graphene growth rate to be readily realized. In this regard, a carbon-containing gas (e.g., a hydrocarbon) can also be introduced to the plasma being produced proximate to the substrate and the carbonaceous electrode, thereby supplementing the reactive carbon species produced from the carbonaceous electrode alone. Introduction of a carbon-containing gas to the plasma can increase the graphene deposition rate if the native deposition rate is not sufficiently high. At the very least, the synthetic configurations identified by the inventors can allow decreased quantities of a carbon-containing gas to be used compared to related CVD processes. More advantageously, the synthetic configurations identified by the inventors can allow for more efficient production and reaction of reactive carbon species to occur.

Control of the plasma through electronic and spatial means can further provide an additional degree of process control compared to the parameter variation of conventional CVD processes (e.g., time, pressure and temperature). In addition, various dopant species can also be introduced into the plasma that can alter its chemistry and the production of graphene therefrom. In some embodiments, the dopant species can become incorporated in the graphene lattice to change one or more of its electrical, thermal, optical, or mechanical properties.

The embodiments described herein can also offer advantageous high throughput capabilities. Specifically, in some embodiments, the processes described herein can be compatible with reel-to-reel processing strategies, which can allow large substrate areas to be exposed to a reactive carbon species per unit time. Reel-to-reel processing capabilities can allow synthetic configurations with a small "footprint" to be implemented. As further described hereinbelow, the particular embodiments depicted and described herein can offer further advantages as well.

As used herein, the term "atmospheric pressure" refers to the magnitude of the air pressure at sea level, approximately 760 torr.

As used herein, the term "sub-atmospheric pressure" refers to a pressure that is less than atmospheric pressure.

As used herein, the term "metal substrate" refers to a substance having a metal surface, including monolithic metal structures, metal surface coatings on a metallic or non-metallic substrate, and the like. The metal surface on such substrates can be continuous or discontinuous as needed for practicing one or more embodiments described herein.

As used herein, the term "reactive carbon species" refers to internally excited and/or ionized carbon atoms or molecular fragments produced upon gasification of a carbonaceous material at high temperatures.

As used herein, the term "proximate" generally refers to the condition of two entities being in a close spatial relation with one another. In the context of the present embodiments, two entities can be considered proximate to one another if they are about 10 cm apart or less, particularly about 1 mm to about 10 cm apart from one another.

In various embodiments, systems for production of graphene by plasma-enhanced chemical vapor deposition can include a reaction chamber, a reel-to-reel processing line configured to convey a metal substrate within the reaction chamber between a pay-out reel and a take-up reel, a carbonaceous electrode housed within the reaction chamber and disposed proximate to a location through which the metal substrate is conveyed, and a gas inlet configured to flow a plasma-forming gas in a gap between the metal substrate and the carbonaceous electrode. The carbonaceous electrode and the reel-to-reel processing line are electrically connected so as to apply a potential between the metal substrate and the carbonaceous electrode.

Depending on whether one wants to operate the system at atmospheric pressure or a sub-atmospheric pressure, the reel-to-reel processing line can be located inside or outside the reaction chamber. For example, when it is desired to grow graphene on a metal substrate at substantially atmospheric pressure, the pay-out reel and the take-up reel can be located outside the reaction chamber. In locating the pay-out reel and the take-up reel outside the reaction chamber, the reaction to form graphene can be confined to that portion of the metal substrate housed within the reaction chamber at a given time, particularly nearby a generated plasma within the reaction chamber. In such embodiments, the reaction chamber can be open to the atmosphere, thereby allowing the metal substrate to easily pass therethrough. In contrast, when it is desired to grow graphene on a metal substrate at a sub-atmospheric pressure, the reaction chamber can be closed. In such embodiments, the pay-out reel and the take-up reel can both be located within the reaction chamber. Even with the pay-out reel and the take-up reel being housed within the reaction chamber, graphene growth can be confined to only a particular portion of the metal substrate at any given time in some embodiments. Specifically, in some embodiments, graphene growth can be confined in or near a plasma-forming region within the reaction chamber (e.g., in a gap between the carbonaceous electrode and the metal substrate). For completeness, it should be also noted that even when the pay-out reel and the take-up reel are both housed within the reaction chamber and the reaction chamber is closed, graphene growth can still take place at atmospheric pressure in such embodiments. Pressures greater than atmospheric pressure can also be used in a closed reaction chamber in some embodiments.

In general, the carbonaceous electrode of the embodiments described herein can contain any electrically conductive material containing carbon. Illustrative electrically conductive carbon materials can include, for example, graphite, glassy carbon, carbon fibers, and the like. That is, in some embodiments, the carbonaceous electrode can include a graphite electrode, a glassy carbon electrode, a carbon fiber electrode, or any combination thereof.

In other embodiments, the carbonaceous electrode can include an insulating material, such as organic polymer, that has been embedded with particles or inclusions that render it electrically conductive under an applied DC or RF voltage. Such embedded particles or inclusions can include nanomaterials such as carbon nanotubes. Although carbon nanotubes represent a rather expensive carbon source with present carbon nanotube production techniques, the high electrical conductivity of carbon nanotubes can potentially afford some advantages when practicing the embodiments described herein. In related embodiments, graphene platelets can be included in a carbonaceous electrode formed from an organic polymer. When utilizing a carbon nanomaterial and an organic polymer in an electrode, the carbon nanomaterial can primarily be used to convey electrical conductivity to the bulk polymer, rather than representing the predominant carbon source for producing a reactive carbon species. That is, the carbon nanomaterial can be used to the extent necessary to convey electrical conductivity to an organic polymer used for producing a reactive carbon species, although at least a portion of the reactive carbon species may also be formed from the carbon nanomaterial as the electrode is consumed.

Figure 2:
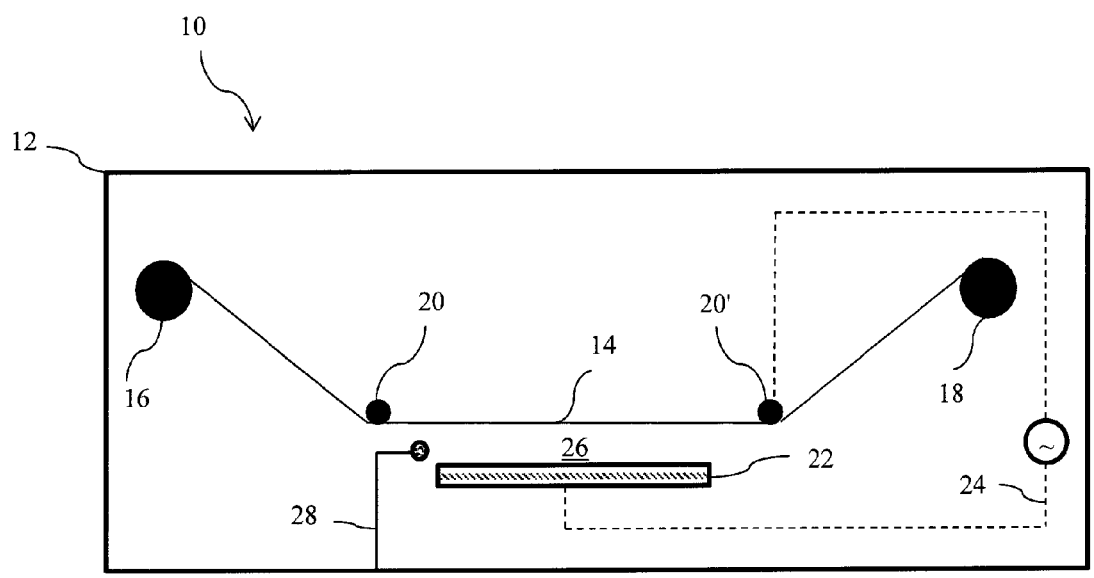

The systems and methods described herein will now be described with further reference to the drawings. FIGS. 1 and 2 show illustrative schematics of systems for producing graphene by plasma-enhanced chemical vapor deposition according to one or more embodiments described herein. The depicted systems can produce graphene in a continuous or semi-continuous (i.e., periodic) manner on a mobile metal substrate. In the configuration of FIG. 1, the system is open for operation at atmospheric pressure, and in FIG. 2, the system is closed for atmospheric pressure operation, sub-atmospheric pressure operation, or elevated pressure operation. That is, the systems depicted in FIGS. 1 and 2 differ primarily in the placement of their reel-to-reel processing line.

Referring to FIG. 1, system 10 includes reaction chamber 12 within which a reel-to-reel processing line conveys metal substrate 14. The direction of conveyance is indicated with arrows in FIG. 1. Reel-to-reel processing line includes pay-out reel 16 and take-up reel 18, each of which is located outside of reaction chamber 12. Tensioning bars 20 and 20' help to provide further guidance of metal substrate 14 as it is being conveyed.

Located proximate to at least a portion of metal substrate 14 within reaction chamber 12 is carbonaceous electrode 22. Carbonaceous electrode 22 is electrically connected to metal substrate 14 by circuit 24, through which a potential is applied, particularly a radiofrequency voltage or a DC voltage for producing a plasma in gap 26. Although FIG. 1 has depicted circuit 24 as establishing an electrical connection to metal substrate 14 via tensioning bar 20', it is to be recognized that an electrical connection can be made to metal substrate 14 at any appropriate location. Moreover, circuit 24 need not necessarily extend to the exterior of reaction chamber 12, as depicted in FIG. 1.

Gap 26 is defined between metal substrate 14 and carbonaceous electrode 22. Gas inlet 28 enters reaction chamber 12 and is configured to supply a gas to gap 26. Although gas inlet 28 has been depicted as entering reaction chamber 12 from the bottom, it is to be recognized that it may enter in any suitable manner to project a gas into gap 26. Upon the application of a suitable potential between metal substrate 14 and carbonaceous electrode 22, a plasma can form from a suitable plasma-forming gas within gap 26. Because metal substrate 14 is located proximate to the location where the plasma is formed, graphene can grow on metal substrate 14 by plasma-enhanced chemical vapor deposition when a catalyst suitable for forming graphene is present on metal substrate 14, or metal substrate 14 itself can catalyst the formation of graphene.

The configuration depicted in FIG. 2 differs from that of FIG. 1 in the placement of its pay-out reel 16 and take-up reel 18. Specifically, these elements are both within reaction chamber 12 in the depicted configuration of FIG. 2. As the remaining elements of FIG. 2 are similar to those of FIG. 1, they will not be described again in detail.

In general, any catalyst suitable for forming graphene by chemical vapor deposition can be used in the embodiments described herein. In some embodiments, the catalyst can be a metallic catalyst. Suitable metallic catalysts can include, for example, copper, nickel, ruthenium, iridium, platinum, alloys thereof, and the like. The metal substrate itself can be formed from the metallic catalyst or metal alloy, or a coating of the metallic catalyst can be applied to a non-metallic substrate in some embodiments. In still further embodiments, a metallic catalyst suitable for forming graphene can be coated upon a metal substrate that is not itself suitable for directly growing graphene. In particular embodiments, the metal substrate can include copper, such as a copper foil.

In various embodiments, methods for production of graphene by plasma-enhanced chemical vapor deposition on a metal substrate are described herein. In various embodiments, the metal substrate can be fixed or conveyed while growing graphene thereon, as discussed hereinafter.

In some embodiments, the methods can include providing a metal substrate and a carbonaceous electrode, applying a potential between the metal substrate and the carbonaceous electrode, exciting a plasma-forming gas in a gap between the metal substrate and the carbonaceous electrode in the presence of the applied potential to form a plasma, ablating a reactive carbon species from the carbonaceous electrode in the presence of the plasma, and growing graphene on the metal substrate from the reactive carbon species. At least a portion of the metal substrate is located proximate to the carbonaceous electrode with a gap defined therebetween.

In some embodiments, the methods can further include conveying the metal substrate while growing graphene thereon. In such embodiments, the metal substrate can be conveyed on a reel-to-reel processing line between a pay-out reel and a take-up reel. The pay-out reel, the take-up reel, or both can be disposed within a reaction chamber, as depicted in FIG. 2 above, or they can both be disposed outside a reaction chamber, as depicted in FIG. 1 above.

As discussed above, the pressure at which it is desired to produce graphene can dictate the chosen configuration of the pay-out and take-up reels. Considerations to be taken into account when choosing a growth pressure include the number of graphene layers to be grown. Fewer graphene layers can be favored by sub-atmospheric deposition pressures. In some embodiments, growing graphene on the metal substrate can take place substantially at atmospheric pressure. In embodiments where atmospheric pressure graphene growth takes place, the reaction chamber can be either open or closed, corresponding to FIGS. 1 and 2 above, respectively. In other embodiments, growing graphene on the metal substrate can take place at a sub-atmospheric pressure. In such embodiments, the reaction chamber in which graphene growth takes place can be closed, as depicted in FIG. 2 above. Suitable sub-atmospheric pressures for graphene growth can include, for example, pressures ranging between about 700 torr and about 750 torr, or between about 650 torr and about 700 torr, or between about 600 torr and about 650 torr, or between about 500 torr and about 600 torr, or between about 400 torr and about 500 torr.

In various embodiments, the plasma-forming gas can include a mixture of hydrogen and a noble gas. Particularly suitable noble gases for inclusion in the plasma-forming gas can include heavy noble gases such as, for example, argon, krypton, xenon and any combination thereof. Light noble gases such as helium and neon can also be included in the plasma-forming gas in other various embodiments. In various embodiments, the plasma-forming gas can include about 0.1% to about 50% hydrogen by volume.

In some embodiments, the plasma-forming gas can further include a hydrocarbon in addition to the hydrogen and noble gas mentioned above. Inclusion of a hydrocarbon in the plasma-forming gas can be desirable if a sufficient growth rate or growth density of graphene on the metal substrate is not achieved using only ablated reactive carbon species formed from the carbonaceous electrode. Accordingly, the techniques described herein can offer significant flexibility toward tuning the properties of the synthesized graphene. Suitable hydrocarbons that can be included in the plasma-forming gas include, but are not limited to, methane, ethane, propane, ethylene, acetylene, and the like. Natural gas can also be used as an inexpensive hydrocarbon source in some embodiments. When present, the hydrocarbon can generally constitute about 20% or less of the plasma-forming gas by volume, more typically about 1% to about 10% hydrocarbon by volume, or about 5% to about 15% hydrocarbon by volume. In some embodiments, the ratio of hydrogen to the hydrocarbon can be greater than about 1:1.

In some embodiments, the methods described herein can include flowing the plasma-forming gas in the gap between the metal substrate and the carbonaceous electrode. Suitable mass velocities across the metal substrate are desirably kept as low as possible, but can include mass velocities up to about 0.1 gram/cm$^2$/sec. In alternative embodiments, a plasma-forming gas can be charged statically to a reaction chamber housing a carbonaceous electrode and a proximately disposed metal substrate. That is, in some embodiments, a plasma can be generated from a non-flowing load of the plasma-forming gas. In various embodiments, the potential applied between the metal substrate and the carbonaceous electrode can be a radiofrequency voltage. Frequencies of electromagnetic radiation suitable for forming a plasma from a plasma-forming gas can include electromagnetic radiation ranging between about 10 MHz to about 30 GHz. In some or other embodiments, the applied potential can be a DC voltage. That is, both radiofrequency and DC plasmas can be used in the various embodiments described herein.

As described above, a desirable feature of the present embodiments is that the energy from a generated plasma can be directed onto the metal substrate and/or the carbonaceous electrode to provide significant advantages, particularly by varying the applied potential such that the plasma is alternately directly between the two as a function of time. Accordingly, in some embodiments, a radiofrequency voltage can further include an underlying waveform whose polarity alternates as a function of time. That is, a background voltage profile can accompany a radiofrequency voltage that can periodically alter the magnitude of the potential between the metal substrate and the carbonaceous electrode. In such embodiments, the plasma energy can be alternately directed onto the metal substrate and the carbonaceous electrode in order to advantageously provide energetic enhancement to both. That is, providing plasma energy to the carbonaceous electrode can advantageously expedite the ablation of reactive carbon species therefrom, and providing plasma energy to the metal substrate can facilitate the reorganization of the reactive carbon species into graphene upon the surface of the metal substrate. In addition, direction of the plasma energy onto the metal substrate can result in further cleaning or etching of the substrate, as well as smoothing of the catalyst surface, thereby further promoting the growth of graphene. It should be noted that these benefits can also be realized without utilization of an underlying waveform in the applied potential. Given the benefit of the present disclosure, one of ordinary skill in the art will be able to determine an appropriate waveform to alternate the magnitude of the applied potential as a function of time to produce a desired outcome during the growth of graphene on the metal substrate.

In more specific embodiments, methods described herein can include providing a metal substrate and a carbonaceous electrode, conveying the metal substrate by the carbonaceous electrode via a reel-to-reel processing line between a pay-out reel and a take-up reel, applying a potential between the metal substrate and the carbonaceous electrode via the reel-to-reel processing line, flowing a plasma-forming gas in a gap between the metal substrate and the carbonaceous electrode in the presence of the applied potential to form a plasma upon exciting the plasma-forming gas, ablating a reactive carbon species from the carbonaceous electrode in the presence of the plasma, and growing graphene on the metal substrate from the reactive carbon species while the metal substrate is being conveyed. At least a portion of the metal substrate is located proximate to the carbonaceous electrode with a gap defined therebetween.

Although the invention has been described with reference to the disclosed embodiments, one skilled in the art will readily appreciate that these are only illustrative of the invention. It should be understood that various modifications can be made without departing from the spirit of the invention. The invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

What is claimed is the following:

1. A method for production of graphene by plasma-enhanced chemical vapor deposition, the method comprising:
   providing a metal substrate and a carbonaceous electrode, at least a portion of the metal substrate being located proximate to the carbonaceous electrode with a gap defined therebetween;
   applying a potential between the metal substrate and the carbonaceous electrode;
   exciting a plasma-forming gas in the gap between the metal substrate and the carbonaceous electrode in the presence of the applied potential, thereby forming a plasma;
   ablating a reactive carbon species from the carbonaceous electrode in the presence of the plasma; and
   growing graphene on the metal substrate from the reactive carbon species.

2. The method of claim 1, wherein the metal substrate comprises copper.

3. The method of claim 1, further comprising:
   conveying the metal substrate while growing graphene thereon, the metal substrate being conveyed on a reel-to-reel processing line between a pay-out reel and a take-up reel.

4. The method of claim 1, wherein the plasma-forming gas comprises a mixture of hydrogen and a noble gas.

5. The method of claim 4, wherein the noble gas comprises argon, krypton, xenon, or any combination thereof.

6. The method of claim 4, wherein the plasma-forming gas further comprises a hydrocarbon.

7. The method of claim 1, wherein the applied potential comprises a radiofrequency voltage or a DC voltage.

8. The method of claim 7, wherein the applied potential further comprises an underlying waveform whose polarity alternates as a function of time.

9. The method of claim 1, wherein growing graphene on the metal substrate takes place at atmospheric pressure.

10. The method of claim 1, wherein growing graphene on the metal substrate takes place at a sub-atmospheric pressure.

11. The method of claim 1, further comprising:
    flowing the plasma-forming gas in the gap between the metal substrate and the carbonaceous electrode.

12. The method of claim 1, wherein the carbonaceous electrode comprises a graphite electrode, a glassy carbon electrode, a carbon fiber electrode, an organic polymer electrode embedded with electrically conductive particles, or any combination thereof.

13. A method for production of graphene by plasma-enhanced chemical vapor deposition, the method comprising:
    providing a metal substrate and a carbonaceous electrode, at least a portion of the metal substrate being located proximate to the carbonaceous electrode with a gap defined therebetween;
    conveying the metal substrate by the carbonaceous electrode via a reel-to-reel processing line between a pay-out reel and a take-up reel;
    applying a potential between the metal substrate and the carbonaceous electrode via the reel-to-reel processing line;
    flowing a plasma-forming gas in the gap between the metal substrate and the carbonaceous electrode in the presence of the applied potential, thereby forming a plasma upon exciting the plasma-forming gas;
    ablating a reactive carbon species from the carbonaceous electrode in the presence of the plasma; and
    growing graphene on the metal substrate from the reactive carbon species, while the metal substrate is being conveyed.

14. The method of claim 13, wherein the metal substrate comprises copper.

15. The method of claim 13, wherein the plasma-forming gas comprises a mixture of hydrogen and a noble gas.

16. The method of claim 15, wherein the plasma-forming gas further comprises a hydrocarbon.

17. The method of claim 13, wherein the applied potential comprises a radiofrequency voltage or a DC voltage.

18. The method of claim 17, wherein the applied potential further comprises an underlying waveform whose polarity alternates as a function of time.

19. The method of claim 13, wherein the carbonaceous electrode comprises a graphite electrode, a glassy carbon electrode, a carbon fiber electrode, an organic polymer electrode embedded with electrically conductive particles, or any combination thereof.

20. A system comprising:
    a reaction chamber;
    a reel-to-reel processing line configured to convey a metal substrate within the reaction chamber between a pay-out reel and a take-up reel;
    a carbonaceous electrode housed within the reaction chamber and disposed proximate to a location through which the metal substrate is conveyed;
      wherein the carbonaceous electrode and the reel-to-reel processing line are electrically connected so as to apply a potential between the metal substrate and the carbonaceous electrode; and
    a gas inlet configured to flow a plasma-forming gas in a gap between the metal substrate and the carbonaceous electrode.

* * * * *